United States Patent [19]

Naus et al.

[11] Patent Number: 5,243,345

[45] Date of Patent: Sep. 7, 1993

[54] SIGMA-DELTA MODULATOR HAVING A PLURAL ORDER LOOP FILTER WITH SUCCESSIVE FILTER SECTIONS OF SUCCESSIVELY SMALLER SIGNAL EXCURSION RANGE

[75] Inventors: Peter J. A. Naus; Eise C. Dijkmans; Petrus A. C. M. Nuijten, all of Eindhoven, Netherlands

[73] Assignee: U.S. Philips Corporation, New York, N.Y.

[21] Appl. No.: 842,855

[22] Filed: Feb. 21, 1992

[30] Foreign Application Priority Data

Mar. 1, 1991 [NL] Netherlands ......................... 9100379

[51] Int. Cl.$^5$ ............................................. H03M 3/00
[52] U.S. Cl. ........................................................ 341/143
[58] Field of Search ........................................... 341/143

[56] References Cited

U.S. PATENT DOCUMENTS

| | | | |
|---|---|---|---|
| 4,509,037 | 4/1985 | Harris | 341/143 |
| 4,772,871 | 9/1988 | Suzuki et al. | 341/155 |
| 5,012,244 | 4/1991 | Wellard et al. | 341/143 |
| 5,055,846 | 10/1991 | Welland | 341/143 X |

OTHER PUBLICATIONS

Chao et al., "A Higher Order Topology for Interpolative Modulators for Oversampling A/D Converters", IEEE Trans. Circuit and Sys. vol. CAS-37, Mar. 1990 pp. 309-318.
Candy et al. "Oversampling Methods for A/D and D/A Conversion", 1992, from IEEE Oversampling Delta-Sigma Data Converters Reprints of Articles from IEEE publications 1962-1990, pp. 1-29.
Candy "A Use of Double Integration in Sigma Delta Modulation", IEEE Transactions on Communication, vol. COM-33, Mar. 1985, pp. 249-258.
Welland et al., "A Stereo 16-Bit Delta-Sigma A/D Converter for Digital Audio", Journal of Audio Engineering Society vol. 37 No. 6, Jun. 1989 pp. 476-485.

Primary Examiner—Howard L. Williams
Attorney, Agent, or Firm—Leroy Eason

[57] ABSTRACT

A sigma-delta modulator comprising a low-pass filter of the Nth order, which is constituted by a series combination of N first-order integrating sections (6.1, 6.2, 6.3, ..., 6.N) each comprising an integrator (12.1, 12.2, 12.3, ..., 12. N) and a limiter (14.1, 14.2, 14.3, ..., 14.N). The individual output signals of the sections are weighted by means of corresponding weighting amplifiers (16.1, 16.2, 16.3, ..., 16.N) and the weighted signals are added together by an adder stage (18). The gains of the sections and the limit values of the limiters are selected so that the last limiter (14.N) in the series arrangement is activated first as the input signal level to the sigma-delta modulator increases, then the last-but-one limiter, and so on. This reduces the order of the filter system each time by one section as the input signal level increases above each successive limit value, thereby causing the sigma-delta modulator to remain stable at all signal levels.

2 Claims, 2 Drawing Sheets

SIGMA-DELTA MODULATOR HAVING A PLURAL ORDER LOOP FILTER WITH SUCCESSIVE FILTER SECTIONS OF SUCCESSIVELY SMALLER SIGNAL EXCURSION RANGE

BACKGROUND OF THE INVENTION

1. Field of the Invention

The invention relates to a sigma-delta modulator for converting an input signal to a digital output signal, comprising:

a difference stage for generating a difference signal in response to the difference between the input signal and a feedback signal;

filter means including:

a plurality N of first-order integrating sections of rank K ranges from 1 to N, these sections being connected in series in ascending order of rank, where K and N are integers greater than or equal to 1, each separate section having an input and an output at which it produces section signal and having a first-order transfer function from the input to the output with a section gain $G_K$ of rank K, the input of the section of rank 1 being connected to receive the difference signal, and in the remaining sections the input of a section of rank K being coupled to the output of the preceding section of rank K−1;

a plurality N of weighting amplifiers of rank K, where K ranges from 1 to N, each having an input coupled to the output of the integrating section of the same rank and having a weight factor $W_K$, for generating N weighted signals;

an adder stage for deriving a filter signal corresponding to the sum of the N weighted signals;

a quantizer for converting the filter signal into the digital output signal; and feedback means for deriving the feedback signal from the digital output signal.

2. Description of the Related Art

A sigma-delta modulator of the foregoing type is known from the article: "A Stero 16-Bit Delta-Sigma A/D Converter for Digital Audio", Journal of the Audio Engineering Society, Vol. 37, No. 6, June 1989, pp. 476–486, FIG. 5. Sigma-delta modulation is a technique by which a digital high-resolution output signal can be obtained with a low-resolution quantizer by means of oversampling. In this technique the digital output signal and is fed back and subtracted from the input signal, the difference signal so obtained is filtered by low-pass filter means and applied to the quantizer. The use of a sufficiently high loop gain for frequencies in the baseband of the input signal achieves that the baseband quantizing noise in the digital output signal is small at the cost of a higher quantizing noise for frequencies above the baseband. This effect is known as noise shaping. The attainable signal-to-noise ratio in the baseband of the digital output signal depends, for example, on the extent of oversampling and on the order of the filter means. A higher-order filter is favourable because it permits lower oversampling frequency while the signal-to-noise ratio in the baseband of the digital output signal is maintained. However, the order is limited by the occurrence of instabilities in the feedback system which are caused, for example, by phase rotation in the loop and by overload of the quantizer. In the known sigma-delta modulator the phase rotation of the higher-order filter is combatted in that zeros are introduced in the filter characteristic of the filter means by weighting the output signals of the first-order sections with the aid of weighting amplifiers and subsequently adding them together in the adder stage. However, the instabilities caused by the quantizer overload continue to occur. They may be avoided by limiting the amplitude of the input signal relative to the theoretically maximum amplitude, but for stabilizing the system this amplitude limitation becomes more limited with an increasing order of the filter means.

Extensive information on the stability of sigma-delta modulators comprising higher-order loop filters and their behaviour with an increasing input signal may be found, for example, in:

(a) the above-cited journal article AES;

(b) "An Analysis of Nonlinear Behaviour in Delta-Sigma Modulators", IEEE Transactions on Circuits and Systems, Vol. CAS-34, No. 6, June 1987, pp. 593–603;

(c) "Companded Predictive Delta Modulation: A Low-Cost Conversion Technique for Digital Recording", Journal of the Audio Engineering Society, Vol. 32, No. 9, September 1984, pp. 659–672;

(d) "A Use of Double Integration in Sigma-Delta Modulation", IEEE Transactions on Communications, Vol. COM-33, No. 3, March 1985, pp. 249–258;

(e) "Oversampled, Linear Predictive and Noise-Shaping Coders of Order N>1", IEEE Transactions of Circuits and Systems, Vol. CAS-25, No. 7, July 1978, pp. 436–447;

(f) "Some Remarks on the Stability and Performance of the Noise Shaper or Sigma-Delta Modulator", IEEE Transactions on Communications, Vol. 36, No. 10 October 1988, pp. 1157–1162;

(g) "A 14-bit 80-kHz Sigma-Delta A/D Converter: Modelling, Design and Performance Evaluation", IEEE Journal of Solid-State Circuits, Vol. 24, No. 2, April 1989;

(h) "Principles of Oversampling A/D Conversion", Journal of the Audio Engineering Society, Vol. 39, No. 178, January/February 1991, pp. 3–26.

Sigma-delta modulators are often used for analog-to-digital and digital-to-analog signal conversion. An objection to the amplitude limitation of the input signal for sigma-delta modulators comprising higher-order loop filters is that, due to the small signal excursion range, the dynamic range is limited by the inherent noise of analog building blocks in an analog-to-digital version of a sigma-delta modulator and by the inherent noise of the subsequent digital-to-analog converter in a digital version of a sigma-delta modulator. Noise reduction in the analog building blocks is difficult to achieve.

SUMMARY OF THE INVENTION

It is an object of the invention to provide a sigma-delta modulator comprising a higher-order loop filter in which there is a less restrictive limitation on the amplitude of the input signal. A sigma-delta modulator according to the invention is thereto characterized, in that each of the sections comprises a limiter for limiting the amplitude of the relevant section signal to a section limit value $L_K$ for rank K, and in that, for each limit value of rank K exceeding 2 the quotient value $Q_K$ of such limit value $L_K$ and a value resulting from the product of the section gain $G_K$, $G_{K-1}$, and so on up to the section gain $G_1$ of rank 1, is smaller than the quotient value $Q_{K-1}$ of the section limit value $L_{K-1}$ and a value resulting from the product of the section gains $G_{K-1} G_{K-2}$ of, and so on up to and including the section gain $G_1$ of rank 1.

All sections comprise a limiter for avoiding instabilities. The selected relation between the values of the section gains $G_K$ and the section limit values $L_K$ achieves that when the input signal increases, the limiter of the last section of rank N starts limiting first, in the event of a still further increasing input signal the limiter of rank $N-1$ starts limiting, and so on. Consequently, the output signal of the relevant section no longer increases and no longer contributes to the loop gain. This reduces the order of the filter means by one each time. Due to this order reduction, the input signal of the sigma-delta modulator can be permitted to increase again without causing any instabilities. Eventually, the system behaves like a sigma-delta modulator comprising a first order filter which modulator can be fully controlled with a nearly 100% input signal. In this manner a higher-order sigma-delta modulator is obtained which remains stable up to the theoretically maximum amplitude of the input signal.

It should be observed that in nearly all above-mentioned publications the use of limiters in the system is discussed. These limiters are used as a kind of emergency brake for avoiding overload or for supperssing instabilities. If more limiters are used, they will be activated concurrently with the exceeding of a specific threshold by the input signal. There is no mention of providing a systematic order reduction by activating the limiters in succession.

An embodiment of the signa-delta modulator according to the invention for analog input signals is further characterized, in that the sigma-delta modulator comprises supply voltage means for supplying the sections with supply voltages which establish for the relevant section a signal excursion range which is substantially as large as the section limit value. By proper scaling of the section gains, the section limit values and the weight factors, it is achieved that limitation occurs for section signal amplitudes which are as large as permitted by the supply voltage. Consequently, limiters may be omitted and a saving on hardware can be realised.

BRIEF DESCRIPTION OF THE DRAWINGS

The invention will be further explained with reference to the annexed drawing, in which.

In all drawing Figures components having like functions or connotations have like reference numerals.

DESCRIPTION OF THE PREFERRED EMBODIMENTS

Figure 1:
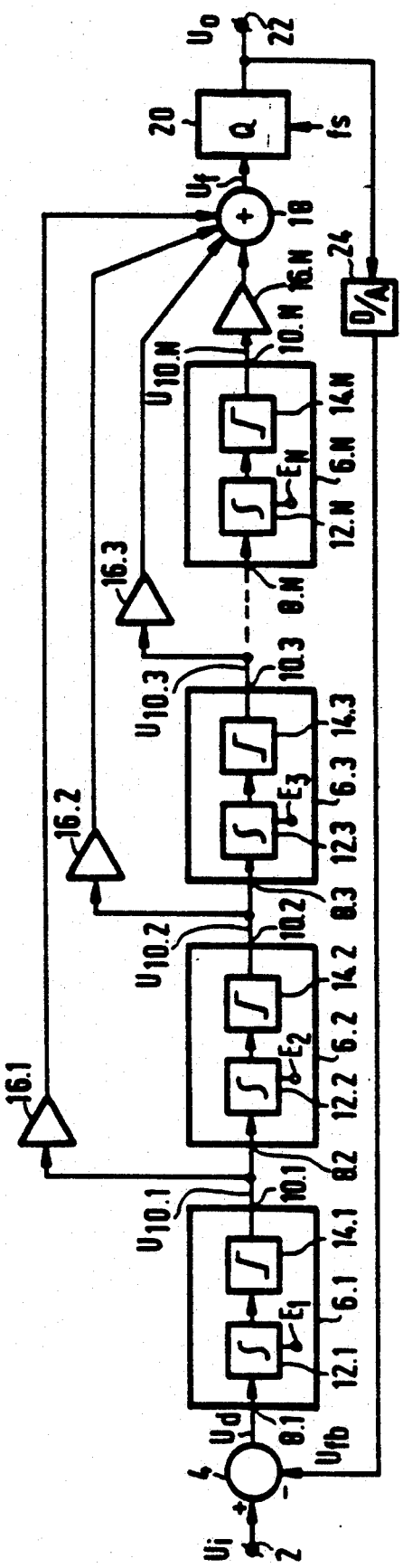
FIG. 1 shows the basic circuit diagram of a sigma-delta modulator according to the invention for analog input signals.

FIG. 1 shows the basic circuit diagram of a sigma-delta modulator according to the invention for digital encoding of analog input signals. The input signal $u_i$ on input 2 and a feedback signal $u_{fb}$ are subtracted from one another in a difference amplifier 4 and converted to a difference signal $u_d$. The difference signal is applied to an N-order low-pass filter, constituted by a series combination of N first-order integrating sections 6.1, 6.2, 6.3, ..., 6.N. The sections have respective inputs 8.1, 8.2, 8.3, ..., 8.N, and have respective outputs 10.1, 10.2, 10.3, ..., 10.N for supplying respective section signals $U_{10.1}$, $U_{10.2}$, $U_{10.3}$, ..., $U_{10.N}$. The sections further include each a first-order integrating network 12.1, 12.2, 12.3, ..., 12.N, followed by a limiter 14.1, 14.2, 14.3, ..., 14.N, which are connected in series between the respective inputs and outputs of the sections. The input 8.1 of the first section 6.1 receives the difference signal $u_d$. The inputs 8.2, 8.3, ..., 8.N of the remaining sections are connected to the respective outputs 10.1, 10.3, ..., 10.N-1 of the relevant preceding sections. The outputs 10.1, 10.2, 10.3, ..., 10.N are further connected by way of respective weighting amplifiers 16.1, 16.2, 16.3, ..., 16.N, to inputs of an adder stage 18 which produces a filter signal $u_f$ which is the sum of the weighted section signals. The filter signal $u_f$ is quantized in a quantizer 20 in response to a clock signal $f_s$ and converted to a digital output signal $u_0$ available at output 22. The digital output signal $u_0$ is also applied to a digital-to-analog converter 24 which reconverts the digital signal to the analog feedback signal $u_{fb}$.

The circuit comprising first-order filter sections, the weighting amplifiers and the adder stage behaves like an N-order transfer function having poles and zeros whose transfer function $u_f/u_d$ is:

$$u_f/u_d = G_1 G_2 G_3 \ldots G_N^* W_N + G_1 G_2 G_3 \ldots G_{N-1}^* W_{N-1} + \ldots + G_1 G_2^* W_2 + G_1^* W_1$$

where $G_1, G_2, G_3, \ldots, G_N$ represent the section gains of the sections 6.1, 6.2, 6.3, ..., 6.N and $W_1, W_2, W_3, \ldots, W_N$ are the weight factors of the weighting amplifiers 16.1, 16.2, 16.3, ..., 16.N. The limiters 14.1, 14.2, 14.3, ..., 14.N limit the section signals to section limit values $L_1, L_2, L_3, \ldots, L_N$. The limiters prevent instabilities in the sigma-delta modulator in the event of an increasing input signal.

Which of the limiters will start operating first in the event of an increasing input signal depends on the individual section gains $G_K$ ($K=1 \ldots N$) and section limit values $L_K$. According to the invention, the values $G_K$ and $L_K$ are selected so that in the event of an increasing input signal $u_i$ the last limiter 14.N of the chain of first-order filter sections starts operating first, followed by the last-but one limiter 14.N−1, and so on. Once the limiter 14.N has started operating, the section gain of section 6.N no longer contributes to the summed signal $u_f$ when the input signal $u_i$ increases even more. Consequently, the order of the low-pass filter is effectively lowered by 1 to N−1. This is continued until the filter order has dropped to 1. Since a sigma-delta modulator comprising a lower-order loop filter may be driven further without becoming unstable, there is constantly a larger signal excursion range due to the order of the limiter function according to the invention. The input signal $u_i$ may thus be driven to almost 100% of the theoretically permitted value.

In order to achieve that the limiters start operating in the order of reducing ranks, the following condition is to be satisfied.

$$\frac{L_K}{G_1 G_2 G_3 \ldots G_K} < \frac{L_{K-1}}{G_1 G_2 G_3 \ldots G_{K-1}}$$

for K=2 to N.

Figure 3:
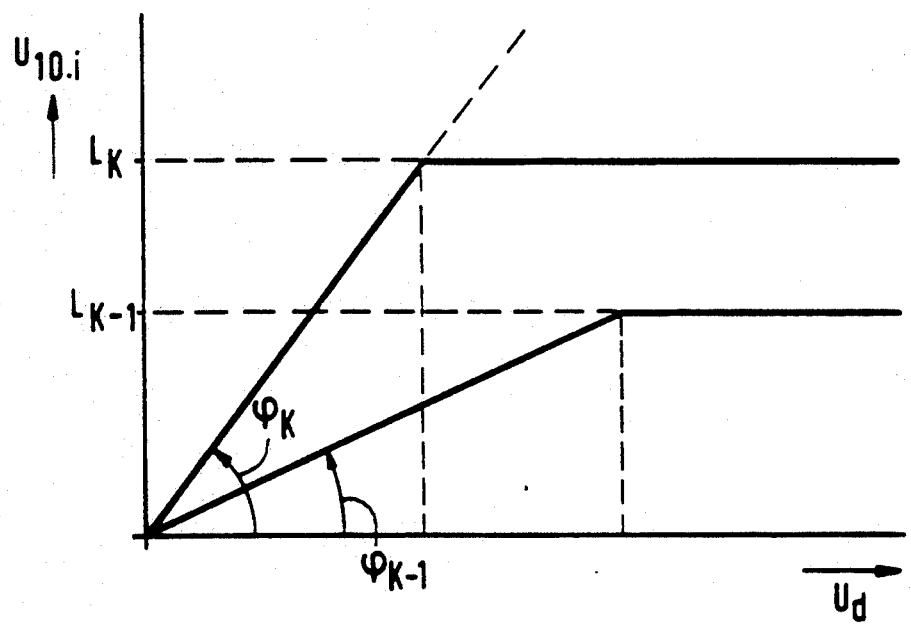
FIG. 3 shows diagrams pertaining to the operation of a sigma-delta modulator according to the invention.

FIG. 3 gives a graphical representation of this relation where the tangent of the angle $\phi_K$ corresponds to $G_1G_2G_3\ldots G_K$ and the tangent of the angle $\phi_{K-1}$ corresponds to $G_1G_2G_3\ldots G_{K-1}$. The section limit values $L_1, L_2, L_3, \ldots, L_N$ need not be equally large. However, the individual values for $G_K$ and $L_K$ may advantageously be selected so that all the section limit values are equal to the signal excursion range, determined by the supply voltage, of the output signals of the first-order integrating networks 12.K. In that case the supply voltage sources $E_1, E_2, \ldots E_N$ for the integrating circuits of the successive integrating sections 6.1, 6.2 ... 6.N have successively lower voltage levels, thereby establishing the successively reduced limit values of the successive integrating sections. The limiters 14.1, 14.2, 14.3, ..., 14.N may then be omitted so that hardware is saved.

Figure 2:
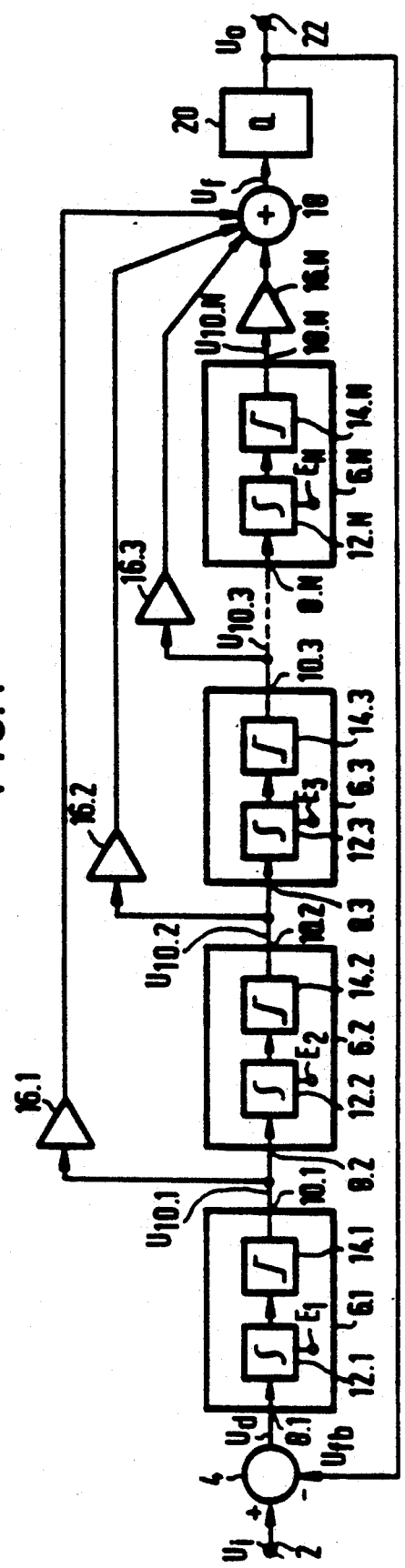
FIG. 2 shows the basic circuit diagram of a sigma-delta modulator according to the invention for digital input signals.

FIG. 2 shows the digital encoding version of the sigma-delta modulator as shown in FIG. 1. The basic circuit diagram is substantially identical. The digital-to-analog converter 24 is not present.

Both versions of the sigma-delta modulators may be implemented with techniques known to those skilled in the art and need not be clarified any further.

We claim:

1. A sigma-delta modulator for converting an input signal into a digital output signal, comprising:

a difference stage for receiving the input signal and a feedback signal, and generating a difference signal corresponding to the difference therebetween;

filter means including:

a plurality N of first-order integrating sections of rank K, where K ranges from 1 to N, connected in series in ascending rank order; each section having an input, an output at which it produces a section output signal, and a first-order transfer function from the input to the output with a section gain $G_K$; the input of the section of rank 1 being connected to said difference stage to receive said difference signal, the input of each remaining section of rank K being coupled to the output of the preceding section of rank $K-1$ to receive therefrom the output signal of the preceding section;

a plurality N of weighting amplifiers of rank K each having an input and an output, the input of each amplifier being coupled to the output of an integrating section of corresponding rank, said amplifiers having respective weighting factors $W_K$ so that N weighted section output signals are produced at the outputs of the N amplifiers; and an adder stage connected to the outputs of the N amplifiers for producing a filter signal corresponding to the sum of the N weighted section output signals;

a quantizer for quantizing the filter signal, the quantized filter signal constituting said digital output signal; and feedback means for deriving said feedback signal from said digital output signal and supplying it to said difference stage;

characterized in that each integrating section of rank K is adapted to limit the amplitude of the output signal produced thereby to a respective limit value $L_K$; each section of rank $K>2$ has an associated quotient $Q_K$ which corresponds to the section limit value $L_K$ divided by the product of the section gains $G_K, G_{K-1}, \ldots G_1$, of that section and of all preceding sections back to and including the section of rank 1; and the quotient $Q_K$ associated with a section of rank K is smaller than the quotient $Q_{K-1}$ of the preceding section of rank $K-1$.

2. A sigma-delta modulator as claimed in claim 1, wherein an integrating section of rank K has a supply voltage of a magnitude such that the amplitude of the section output signal is limited to an excursion range which substantially corresponds to the section limit value $L_K$.

* * * * *